(12) United States Patent
    Boschke et al.

(10) Patent No.: US 9,236,440 B2
(45) Date of Patent: Jan. 12, 2016

(54) SANDWICH SILICIDATION FOR FULLY SILICIDED GATE FORMATION

(71) Applicant: GLOBALFOUNDRIES Inc., Grand Cayman (KY)

(72) Inventors: Roman Boschke, Dresden (DE); Stefan Flachowsky, Dresden (DE); Elke Erben, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/097,338

(22) Filed: Dec. 5, 2013

(65) Prior Publication Data

US 2015/0162414 A1    Jun. 11, 2015

(51) Int. Cl.
    *H01L 21/44*    (2006.01)
    *H01L 29/49*    (2006.01)
    *H01L 29/51*    (2006.01)

(52) U.S. Cl.
    CPC .......... *H01L 29/4958* (2013.01); *H01L 29/517* (2013.01)

(58) Field of Classification Search
    CPC ............... H01L 21/28079; H01L 21/28088; H01L 21/28518; H01L 21/324; H01L 21/76828; H01L 21/76864; H01L 21/76889; H01L 21/823443; H01L 21/823814; H01L 21/823835; H01L 21/823842

USPC ......... 438/583, 648, 649, 652, 655, 656, 660, 438/664, 682, 683, 685, 688, FOR. 338, 438/FOR. 360; 257/377, 382, 384, 388, 257/412, 750, 754, 757, 768, 770, E29.161, 257/E23.157, E21.006, E21.199, E21.593
See application file for complete search history.

(56) References Cited

U.S. PATENT DOCUMENTS

| | | | |
|---|---|---|---|
| 6,821,887 B2 | 11/2004 | Wieczorek et al. | |
| 2006/0205133 A1* | 9/2006 | Trivedi | H01L 21/26506 438/199 |
| 2006/0267087 A1* | 11/2006 | Chiu et al. | 257/335 |
| 2007/0278593 A1* | 12/2007 | Watanabe | 257/374 |
| 2008/0290370 A1* | 11/2008 | Han et al. | 257/192 |

* cited by examiner

*Primary Examiner* — Kyoung Lee
*Assistant Examiner* — Joannie A Garcia
(74) *Attorney, Agent, or Firm* — Amerson Law Firm, PLLC

(57) ABSTRACT

When forming field effect transistors, a common problem is the formation of a Schottky barrier at the interface between a metal thin film in the gate electrode and a semiconductor material, typically polysilicon, formed thereupon. Fully silicided gates are known in the state of the art which may overcome this problem. The claimed method proposes an improved fully silicided gate achieved by forming a gate structure including an additional metal layer between the metal gate layer and the gate semiconductor material. A silicidation process can then be optimized so as to form a lower metal silicide layer comprising the metal of the additional metal layer and an upper metal silicide layer forming an interface with the lower metal silicide layer.

28 Claims, 8 Drawing Sheets

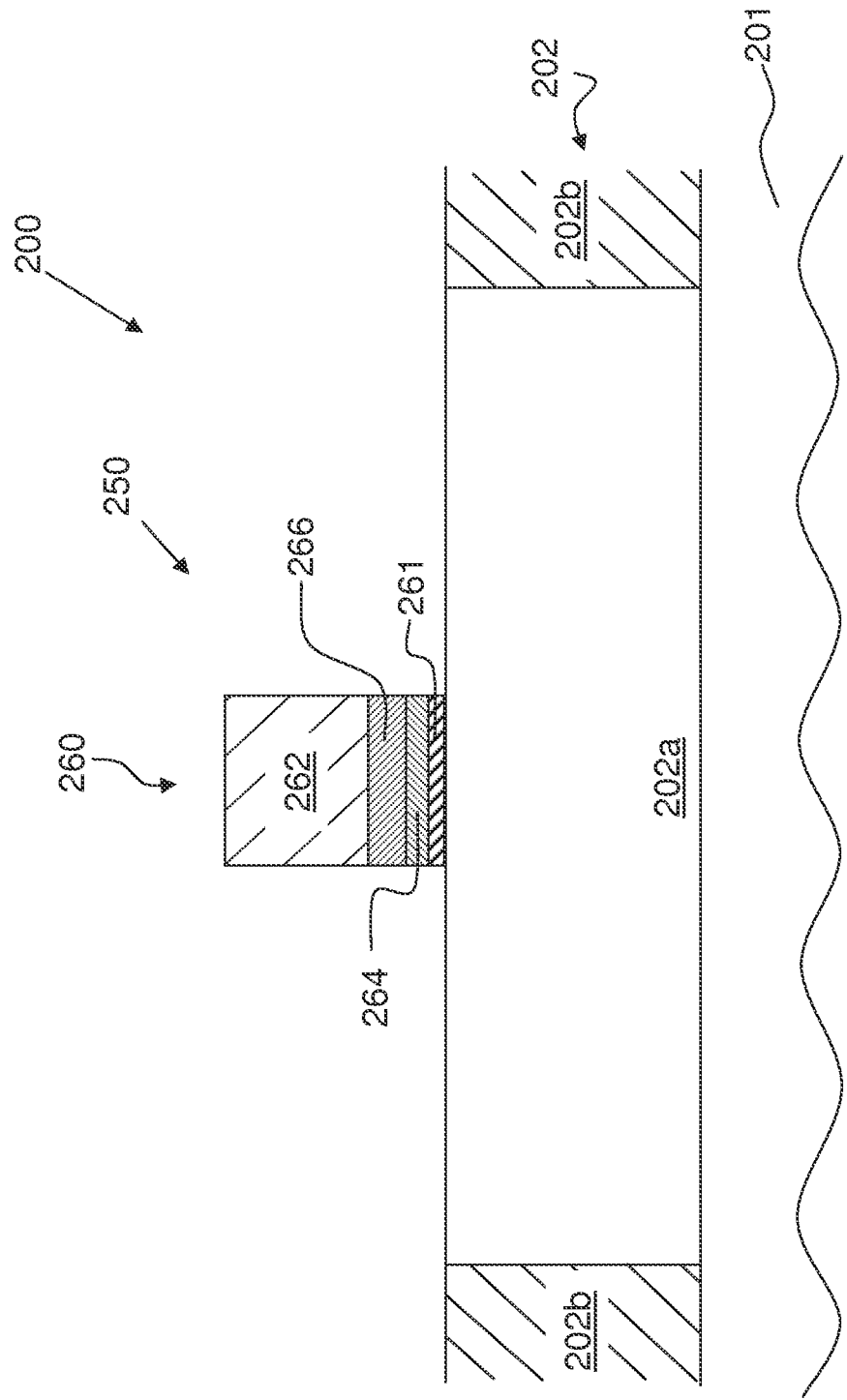

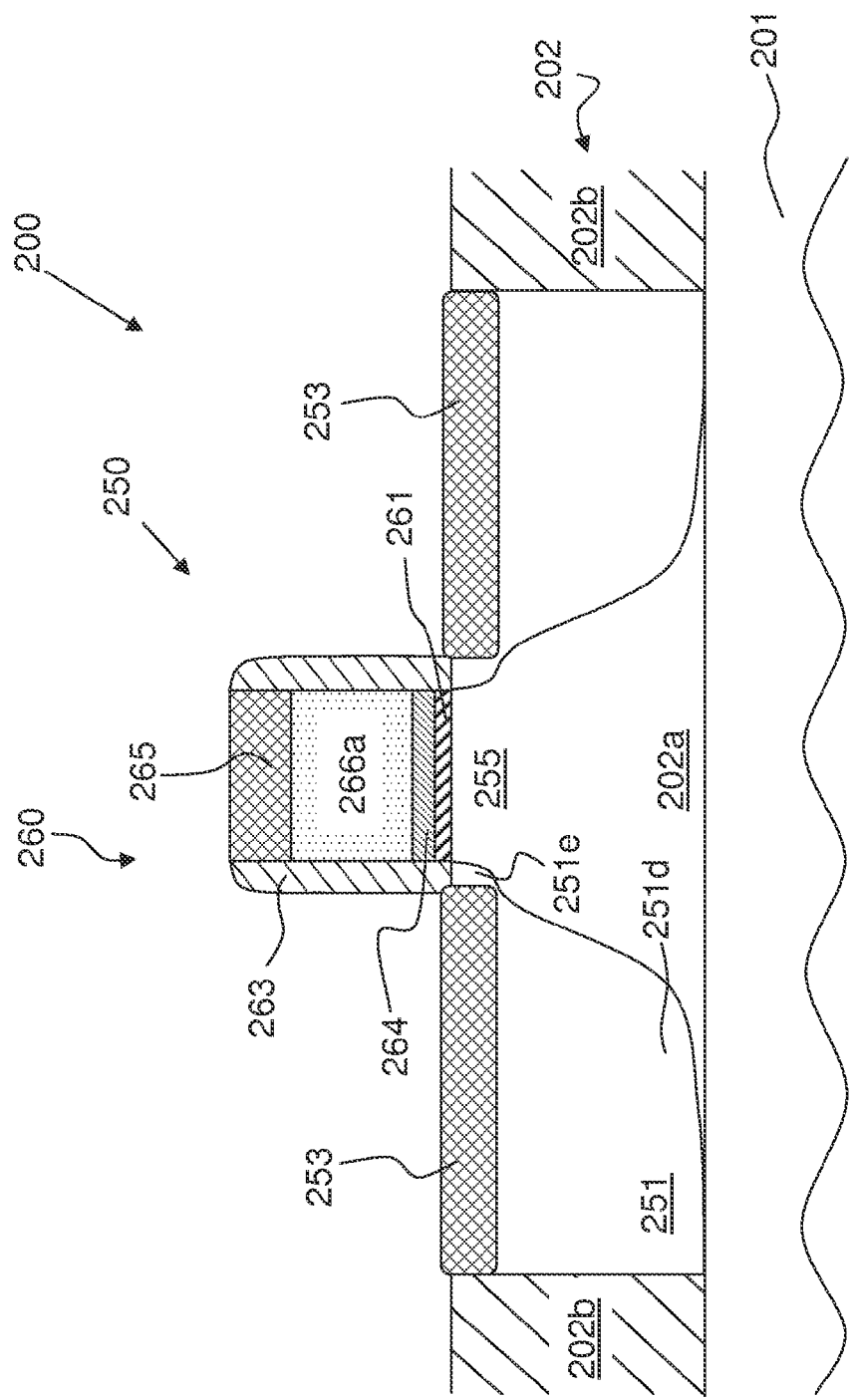

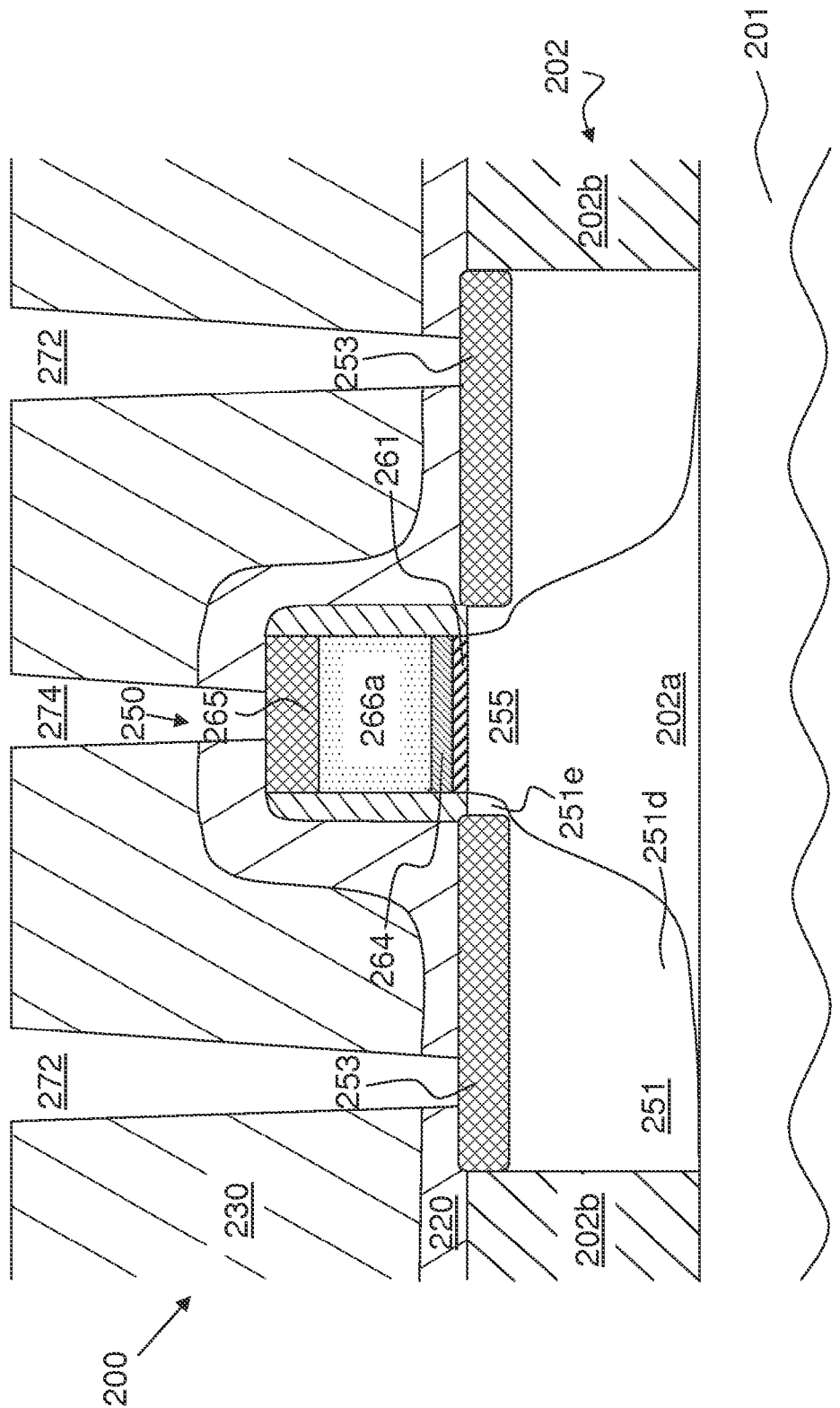

SANDWICH SILICIDATION FOR FULLY SILICIDED GATE FORMATION

BACKGROUND OF THE INVENTION

1. Field of the Invention

Generally, the present disclosure relates to integrated circuits, and, more particularly, to transistors comprising a gate with a metal layer.

2. Description of the Related Art

Transistors are the dominant components in modern electronic devices. Currently, several hundred millions of transistors may be provided in presently available complex integrated circuits, such as microprocessors, CPUs, storage chips and the like. It is then crucial that the typical dimensions of the transistors included in an integrated circuit have as small as possible typical dimensions, so as to enable a high integration density.

One of the most widespread technologies is the complementary metal-oxide-semiconductor (CMOS) technology, wherein complementary field effect transistors (FETs), i.e., P-channel FETs and N-channel FETs, are used for forming circuit elements, such as inverters and other logic gates, to design highly complex circuit assemblies.

Transistors are usually formed in active regions defined within a semiconductor layer supported by a substrate. Presently, the layer in which most integrated circuits are formed is made out of silicon, which may be provided in crystalline, polycrystalline or amorphous form. Other materials, such as, for example, dopant atoms or ions, may be introduced into the original semiconductor layer.

When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages, such as dopant ion implantations, source and drain region formation and substrate silicidation, are performed in the presence of a sacrificial dummy gate. The dummy gate is replaced by the real gate after the high-temperature source/drain formation and all silicide annealing cycles have been carried out.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges and requires new integration schemes with respect to the conventional poly/SiON technology.

For example, new materials have to be found in order to tune the work function of gate electrode species, so as to adjust the transistor threshold voltage to a desired level.

In the gate-first HKMG approach, a thin film of a silicon/germanium (SiGe) alloy is deposited on the surface of the silicon layer in order to adjust the transistor threshold voltage to a desired level. Since a portion of this thin film is included in the channel region of the FET, this SiGe thin film is also commonly referred to as "channel SiGe."

Furthermore, in the HKMG technology, a thin "work function metal" layer is inserted between the high-k dielectric and the gate material placed above the high-k dielectric. The threshold voltage can thus be adjusted by varying the thickness of the metal layer. The gate metal layer may comprise, for example, tantalum (Ta), tungsten (W), titanium nitride (TiN) or tantalum nitride (TaN). A work function metal, such as, for example, aluminum, may also be included in the gate metal layer.

Since the gate material formed on top of the gate metal layer is usually a semiconductor, for example, polysilicon, a Schottky barrier is established at the interface between the gate metal layer and the gate semiconductor material. This undesirably degrades the AC performance by limiting the circuit switching speed.

FIGS. 1a-1c show some aspects of a transistor manufacturing flow according to the known gate-first HKMG approach.

FIG. 1a schematically illustrates a cross-sectional view of a semiconductor structure 100 in an advanced manufacturing stage. The semiconductor structure 100 has been obtained after forming insulation regions 102b in a semiconductor layer 102. The insulation regions 102b may have been formed as shallow trench isolations. The semiconductor layer 102, typically comprising mono-crystalline silicon, is formed on a substrate 101, which may be comprised of any appropriate carrier.

Active regions 102a are subsequently formed in the semiconductor layer 102. This may comprise performing one or more well implantations. Active regions are to be understood as semiconductor regions in and above which one or more transistors are to be formed. For convenience of display, a single active region 102a is illustrated, which is laterally limited by insulation regions 102b.

FIG. 1a shows that a FET 150 has been formed after defining the active region 102a. In the gate-first HKMG, a gate structure 160 is formed on the upper surface of the active region 102a. Although not shown, a thin channel SiGe film may have been deposited on the surface of the active region 102a before forming the gate structure 160.

The gate structure 160 is formed by sequentially stacking layers of different materials, which are subsequently patterned so as to obtain the desired gate structure size and dimensions. The stack making up the gate structure 160 comprises an insulation layer 161 formed on the surface of the active region 102a, a gate metal layer 164 and a gate material layer 162 exposed to the outside.

The insulation layer 161, formed on the surface of the active region 102a, comprises a high-k material. The gate metal layer 164 is formed between the insulation layer 161 and the gate material 162 so as to adjust the transistor threshold voltage. The gate material layer 162, formed directly on the upper surface of the gate metal layer 164, typically comprises a semiconductor such as polysilicon.

FIG. 1b shows that, after forming the gate stack, this can be protected by forming a spacer structure 163 on its sidewalls. The spacer structure 163 may be advantageously used as an implantation mask in subsequent manufacturing stages.

After forming the gate structure 160 and the spacer structure 163, several implantations are carried out in order to define source and drain regions 151 of the transistor 150. The implantations may comprise halo/extension implants giving rise to extension regions 151e and halo regions (not shown) in the active region 102a. After performing halo/extension implantations, the spacer structure 163 may be broadened and an additional series of implantations may be carried out in order to form deep regions 151d of source and drain regions 151.

An annealing step follows the series of implantations defining source and drain regions 151. Annealing is performed in order to activate the implanted dopant ions and to allow the crystalline structure to recover from implantation damage. After the annealing process, a channel region 155 of the transistor 150 rests defined between source and drain regions 151.

After the annealing step, metal silicide layers 153 and 165 are formed in order to decrease the contact resistance to the electrodes of the transistor 150, as shown in FIG. 1c.

Salicidation (i.e., self-aligned silicidation) is typically performed by depositing a refractory metal layer onto the exposed face of the semiconductor structure 100. The refractory metal layer may comprise, for example, a metal such as nickel, titanium, cobalt and the like. Preferably, the refractory metal layer comprises nickel. The refractory metal layer may also comprise platinum, which in some cases may promote a more homogeneous formation of nickel monosilicide.

A heat treatment is then applied to the semiconductor structure 100 in order to promote a chemical reaction between the metal atoms of the deposited layer and the silicon atoms of the exposed surface of the semiconductor structure 100.

FIG. 1c shows that, as a result of the heat treatment, the metal silicide layer 153 has formed partly in and partly on top of the active region 102a, thus forming an interface with the source and drain regions 151. Furthermore, the metal silicide layer 165 has formed on top of the gate structure 160, thus forming an interface with the gate material 162 exposed before the deposition of the refractory metal layer. It should be noted that the silicon material contained in the sidewall spacer structure 163 and the isolation regions 102b does not substantially take part in the chemical reaction induced during the heat treatment process, as it is present in those features only as a thermally stable silicon dioxide and/or silicon nitride material.

As said above, the transistor resulting from the above-described manufacturing flow is affected by the drawback of the Schottky barrier forming at the interface between the gate metal layer 164 and the gate material 162. In order to get rid of this Schottky barrier, it would be convenient to form a metal silicide layer 165 of a thickness sufficient for directly forming an interface with the gate metal layer 164.

One method of achieving this goal is forming so-called "fully silicided" gates, wherein the metal silicide layer 165 totally replaces the gate material 162 so as to directly contact the gate metal layer 164.

In the state of the art, formation of fully silicided gates has been limited by the correlation existing between the thickness of the metal silicide layer 153 on the source/drain regions and that of the metal silicide layer 165 on top of the gate. This is due to the fact that typically the same salicidation step is used for forming metal silicide layers 153 and 165. Thus, increasing the thickness of the metal silicide 165 on the gate structure generally causes a simultaneous increase of the thickness of the metal silicide 153 contacting the source/drain regions of the transistor.

However, the thickness of the source/drain metal silicide 153 may not be increased beyond an upper limit. In general, the thickness of the metal silicide layer 153 must be considerably smaller than the thickness of the semiconductor layer 102. This limitation becomes more and more problematic as the typical device sizes decrease, since reducing, for example, the gate length also requires a corresponding scaling of the source and drain regions 151 in the vertical direction.

An example of a method of forming a fully silicided gate structure may be found in U.S. Pat. No. 6,821,887. In this patent, the height of the gate structure is appropriately chosen so as to permit the reaction of all gate material with the refractive metal during the silicidation process described above. However, this method poses a stringent limitation on the vertical dimension of the gate structure.

By using known methods, it is thus particularly difficult to obtain a fully silicided gate while maintaining the thickness of the source/drain metal silicide layer at a sufficiently low value. Therefore, a need arises for an improved transistor manufacturing method, permitting formation of a fully silicided gate which does not require a simultaneous broadening of the source/drain metal silicide layers.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the new and inventive idea that the manufacturing process of a transistor can be improved by introducing an additional pure metal layer between the gate metal layer and the gate material in an HKMG structure. In this manner, two metal silicide layers can be formed in the gate structure: a first metal silicide layer in electrical contact with the gate metal layer and a second metal silicide layer formed on the first metal silicide layer. Based on this idea, one illustrative semiconductor structure includes an active region formed in a semiconductor layer and a transistor having a gate structure and a source region and a drain region formed in the active region, wherein the gate structure includes a gate insulating layer formed on the surface of the active region, a gate metal layer formed on the insulating layer, a first metal silicide layer formed on the gate metal layer and a second metal silicide layer formed on the first metal silicide layer. The gate structure of the semiconductor structure implements a fully silicided metal gate, since the second metal silicide layer is in electrical contact with the gate metal layer through the first metal silicide layer, without the presence of any gate semiconductor material between the gate metal layer and the second metal silicide layer. Furthermore, due to the presence of the first metal silicide layer, the thickness of the first metal layer can be maintained low, while simultaneously ensuring that the first and second metal silicide layer are in electrical contact.

A method of forming a semiconductor structure is also provided which includes forming an active region in a semiconductor layer and forming a gate structure on the active region, wherein forming the gate structure includes forming an insulating layer on the surface of the active region, forming a gate metal layer on the insulating layer, forming a pure metal layer on the gate metal layer and forming a gate material layer on the pure metal layer.

BRIEF DESCRIPTION OF THE DRAWINGS

The disclosure may be understood by reference to the following description taken in conjunction with the accompanying drawings, in which like reference numerals identify like elements, and in which:

FIGS. 2a-2e schematically illustrate cross-sectional views of a semiconductor structure during subsequent manufacturing stages of a manufacturing process flow according to an embodiment of the present invention.

Figure 1A:
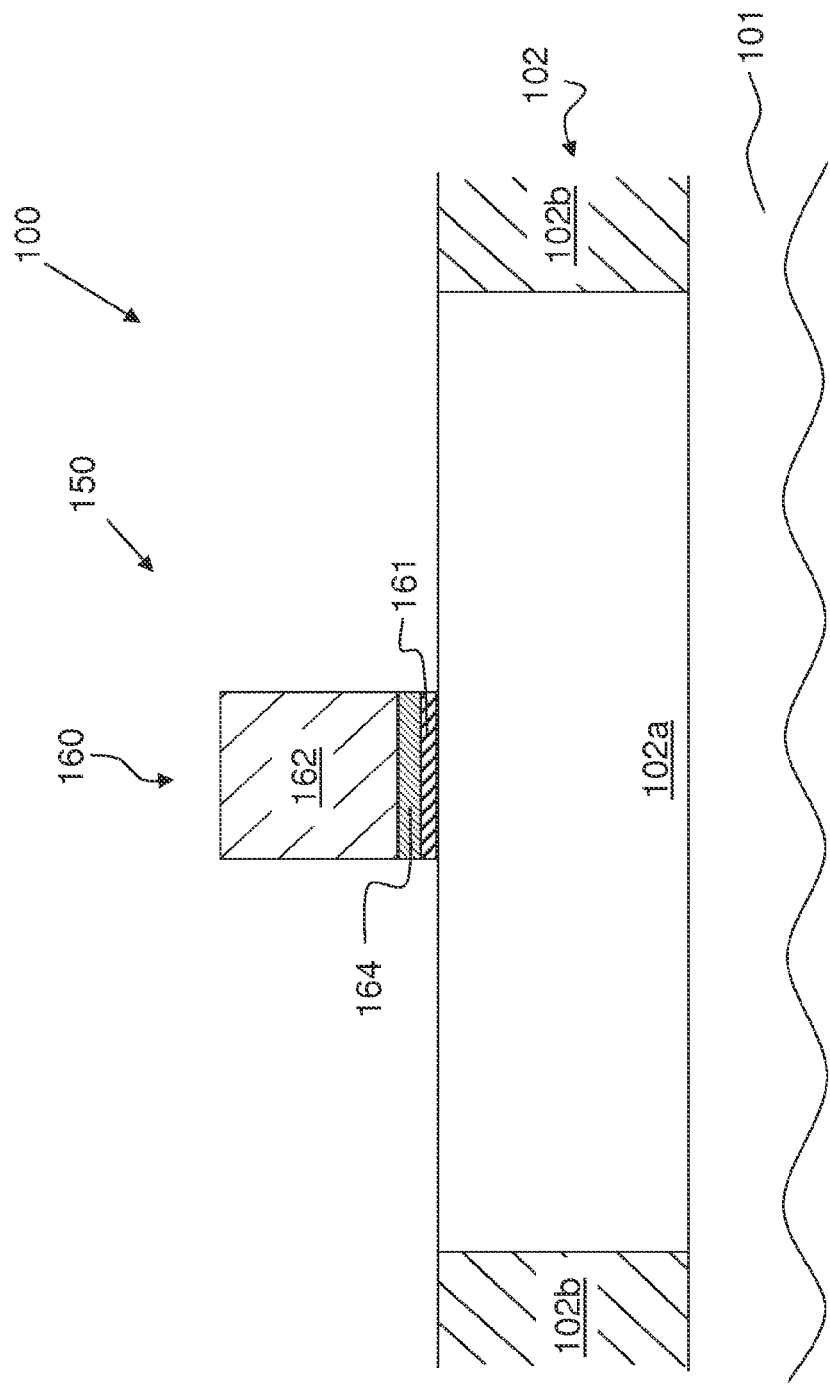
FIGS. 1a-1c schematically illustrate cross-sectional views of a semiconductor structure comprising a transistor during subsequent stages of a manufacturing process flow according to the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1B:
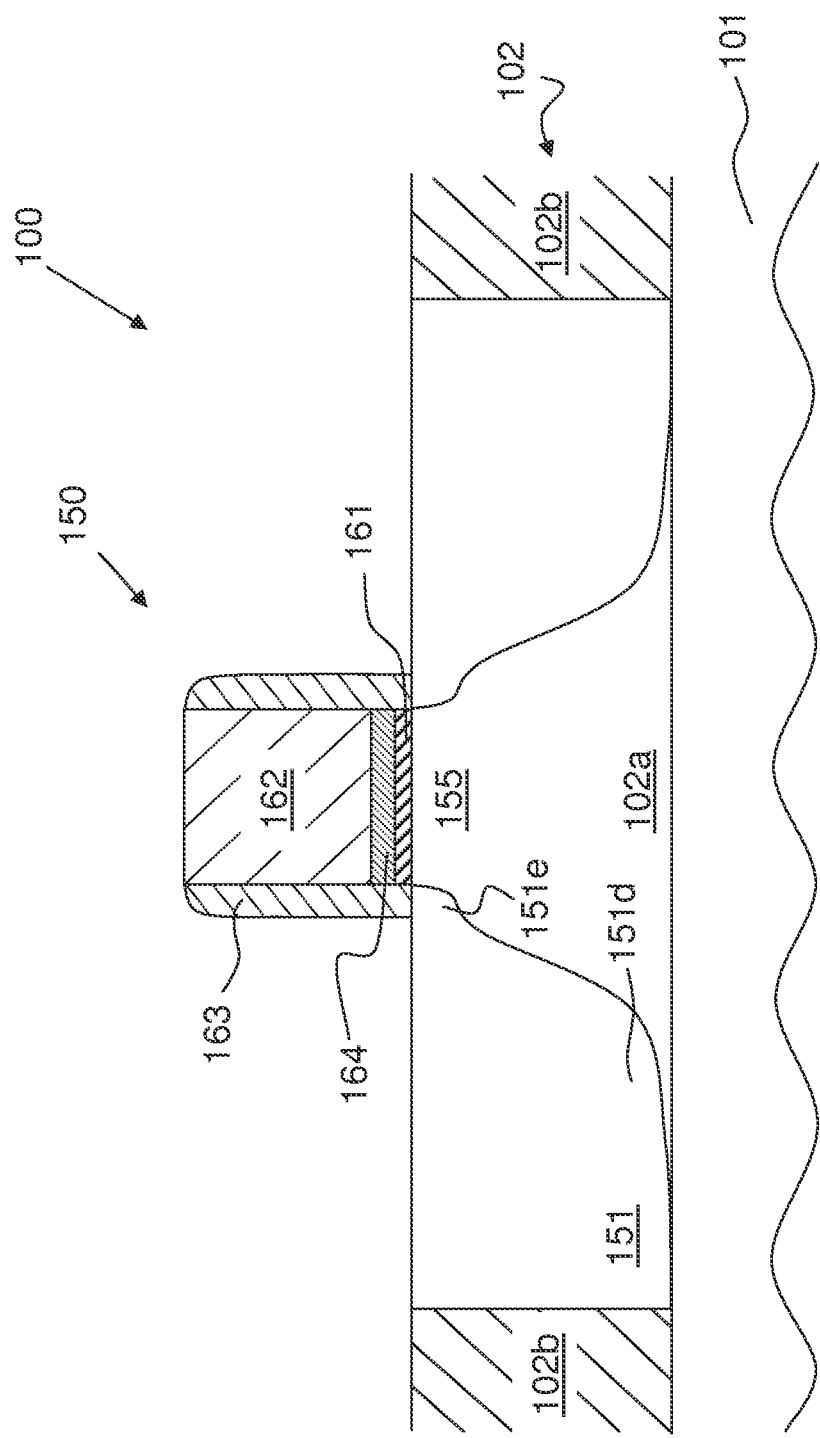
Figure 1C:
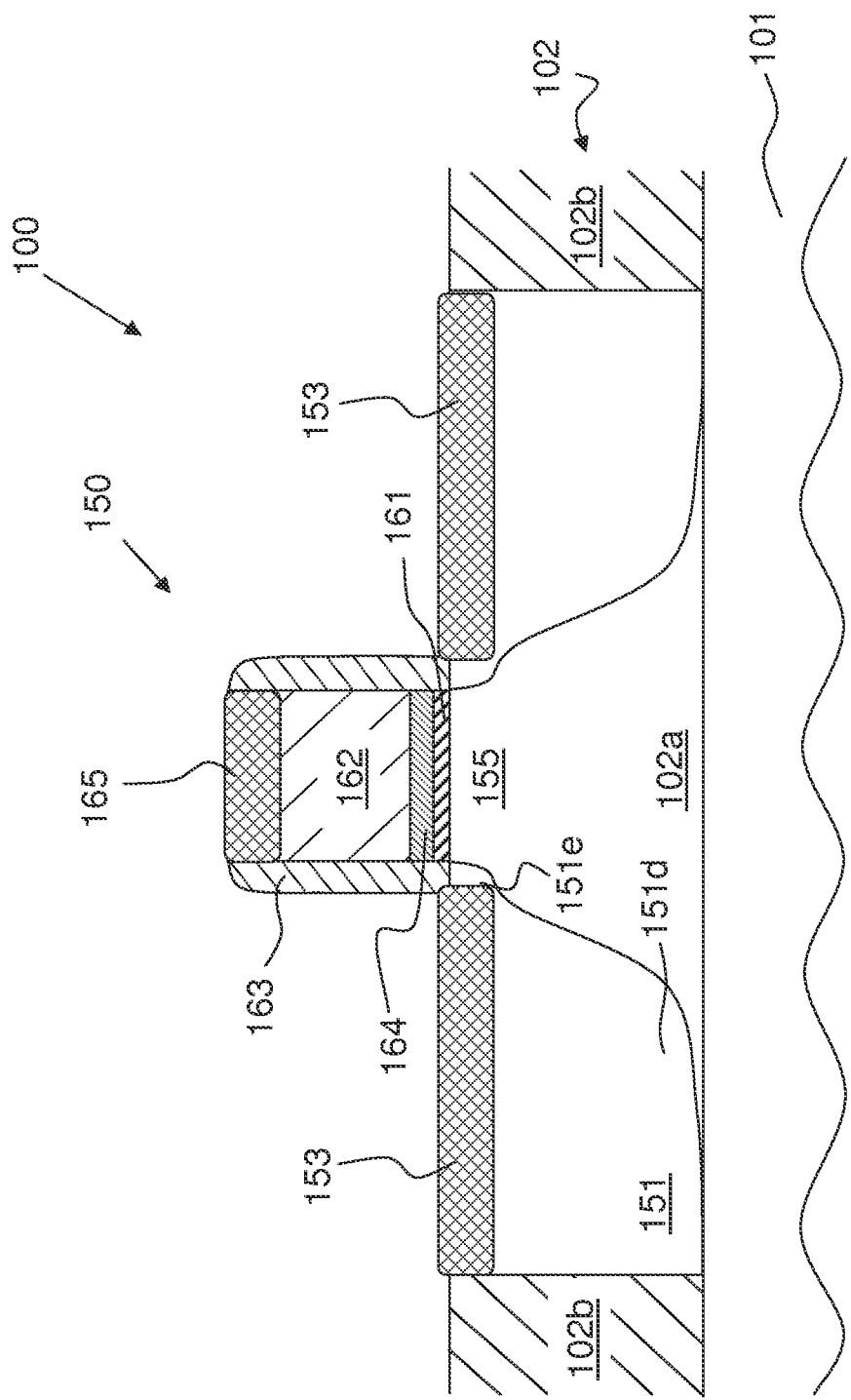

It should be noted that, where appropriate, the reference numbers used in describing the various elements illustrated in FIGS. 2a-2e substantially correspond to the reference numbers used in describing the corresponding elements illustrated in FIGS. 1a-1c above, except that the leading numeral for corresponding features has been changed from a "1" to a "2". For example, semiconductor device 100 corresponds to semiconductor device 200, gate insulation layer 161 corresponds to gate insulation layer 261, gate electrode 160 corresponds to gate electrode 260, and so on. Accordingly, the reference number designations used to identify some elements of the presently disclosed subject matter may be illustrated in FIGS. 2a-2e but may not be specifically described in the following disclosure. In those instances, it should be understood that the numbered elements shown in FIGS. 2a-2e which are not described in detail below substantially correspond with their like-numbered counterparts illustrated in FIGS. 1a-1c, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2a, it should be understood that the gate electrode structure 260 is formed "above" the active region 202a and that the pure metal layer 266 is formed "below" or "under" the gate material 262.

FIG. 2a shows a cross section of a semiconductor structure 200 during an advanced manufacturing stage substantially corresponding to the fabrication method according to the prior art shown in FIG. 1a.

The semiconductor structure 200 comprises a semiconductor layer 202 in which isolation regions 202b have been formed. Isolation regions 202b may comprise, for example, shallow trench isolations. The isolation regions 202b laterally define an active region 202a. A plurality of active regions 202a may be formed in the semiconductor layer 202, although only one is shown in FIG. 2a. One or a series of implantations, e.g., well implantations, may have been performed in order to provide active region 202a with a desired doping profile.

According to one embodiment, the semiconductor layer 202 comprises silicon. According to a particular embodiment, the semiconductor layer 202 comprises mono-crystalline silicon.

The layer 202 is formed attached to a substrate 201. The substrate 201, which may represent any appropriate carrier material, and the semiconductor layer 202 may form a silicon-on-insulator (SOI) configuration. Alternatively, the semiconductor layer 202 may be formed in the bulk of the substrate 201.

Although not shown, a thin film of a semiconductor alloy, e.g., a channel SiGe film, may have been epitaxially formed on the surface of the semiconductor layer 202.

The semiconductor structure 200 comprises a transistor 250 formed partly in and partly on the semiconductor layer 202. The transistor 250 may be a FET, for example an N-channel FET or a P-channel FET. For example, the transistor 250 may form with a second transistor of an opposite polarity (not shown) a pair used in the CMOS technology.

The transistor 250 comprises a gate structure 260, formed on the surface of the semiconductor layer 202 after having defined the active region 202a and, where needed, after forming a channel semiconductor alloy film. The semiconductor alloy may comprise SiGe. The gate structure 260 is preferably formed according to the HKMG technology. According to a particular embodiment, the gate structure 260 is performed according to the gate-first HKMG approach.

Thus, the gate structure 260 comprises a gate insulating layer 261 formed directly on the surface of the active region 202a. The insulating layer 261 comprises a high-k material. By high-k material it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

The gate structure 260 further comprises a gate metal layer 264 formed on the gate insulating layer 261 in order to permit threshold voltage adjustment. The gate metal layer 264 may comprise a metal such as tantalum or tungsten. Preferably, the gate metal layer 264 comprises a nitride such as, for example, titanium nitride or tantalum nitride. A certain percentage of a work function metal species, such as aluminum and the like, may be included in the gate metal layer 264 in combination with other materials.

A gate material layer 262 is then formed in the gate structure 260 so as to expose an upper surface thereof to the outside. Typically, the gate material layer 262 comprises a semiconductor. In some embodiments, the gate material layer 262 comprises polysilicon.

Unlike the gate structure known from the prior art described above, the gate structure 260 according to one embodiment of this disclosure further comprises a pure metal layer 266 formed on the gate metal layer 264 so as to form an interface and be in electrical contact therewith. The gate material layer 262 is then formed directly on the pure metal layer 266, so that the pure metal layer 266 is sandwiched between the gate material layer 262 and the gate metal layer 264.

The pure metal layer 266 comprises a metal which, when the system is heated, can form a metal silicide compound with the semiconductor material of the gate material layer 262. For example, the pure metal layer 266 may comprise a refractory metal. In some embodiments, the metal layer 266 comprises at least one of titanium (Ti) or cobalt (Co). Alternatively, the pure metal layer 266 may comprise any metal known in the art. Examples of metals which can be used for forming the pure metal layer 266 include copper, gold, silver, aluminum, etc. In some embodiments, the thickness of the pure metal layer 266 ranges from about 10-30 nm. In general, the thickness of the pure metal layer 266 is chosen so that, during a salicidation process described in the following, a lower-lying silicide layer formed as a result of the reaction of the pure metal layer 266 with the gate material 262 merges with an upper-lying metal silicide layer formed above the lower-lying silicide layer, thereby resulting in a fully silicided gate.

Figure 2B:
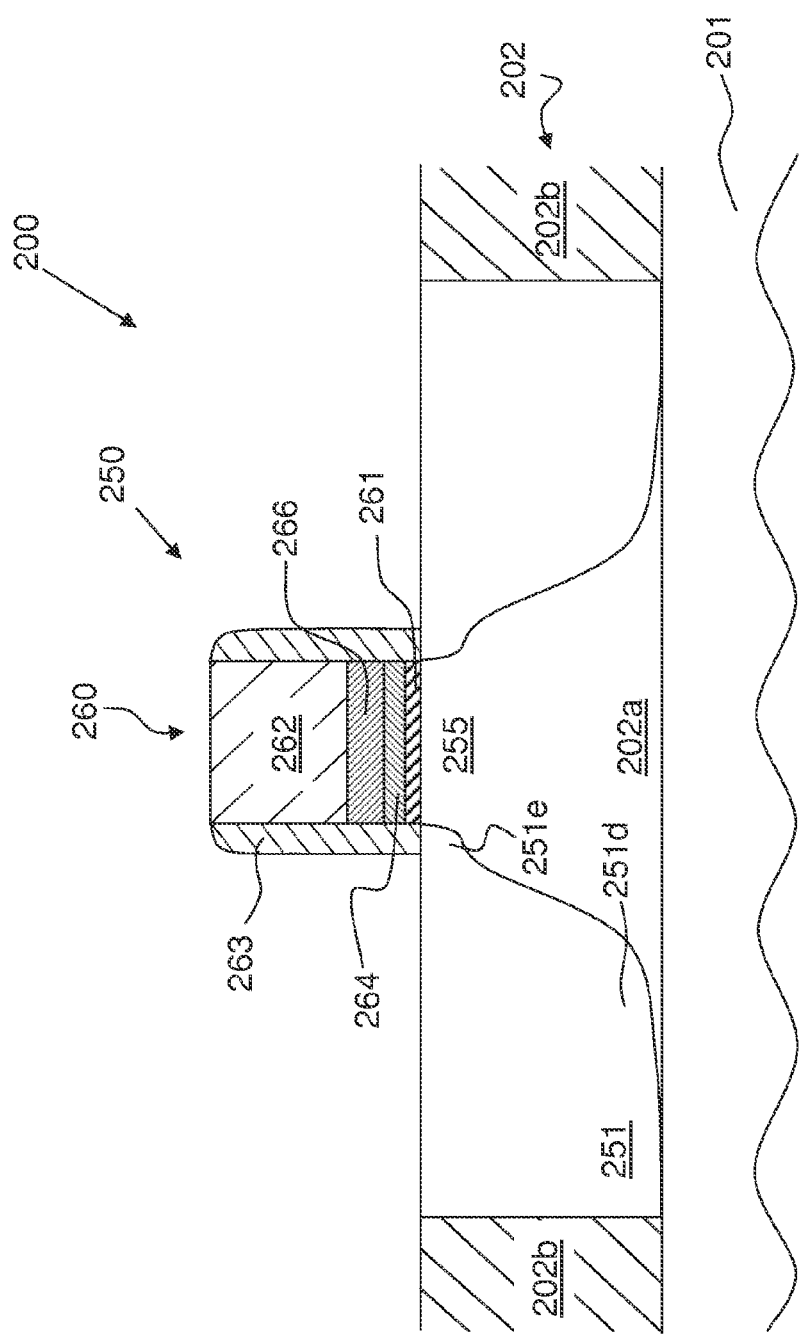

As shown in FIG. 2b, a spacer structure 263 is formed on the sidewalls of the gate stack 260. Subsequently, source and drain regions 251 of the transistor 250 are formed in the active region 202a. Formation of the source/drain regions 251 is achieved in an analogous way to the traditional manufacturing flow described with reference to FIG. 1b. Namely, a first series of ion implantations is usually performed so as to define halo regions (not shown) and extension regions 251e in the active region 202a. Subsequently, a second series of implantations is performed in order to define deep regions 251d of the source/drain regions 251. The spacer structure 263 may be conveniently broadened after performing halo/extension implantations and before starting the second series of implantations forming deep regions 251d.

After performing all necessary implantations for defining source/drain regions 251, the semiconductor structure 200 is annealed in order to activate the implanted ions and allow the lattice structure of the semiconductor layer 250 to recover from implantation damage. At the end of the annealing process, the channel region 255 of the transistor 250 rests defined in the active region 202a between the source and the drain regions 251.

Figure 2C:
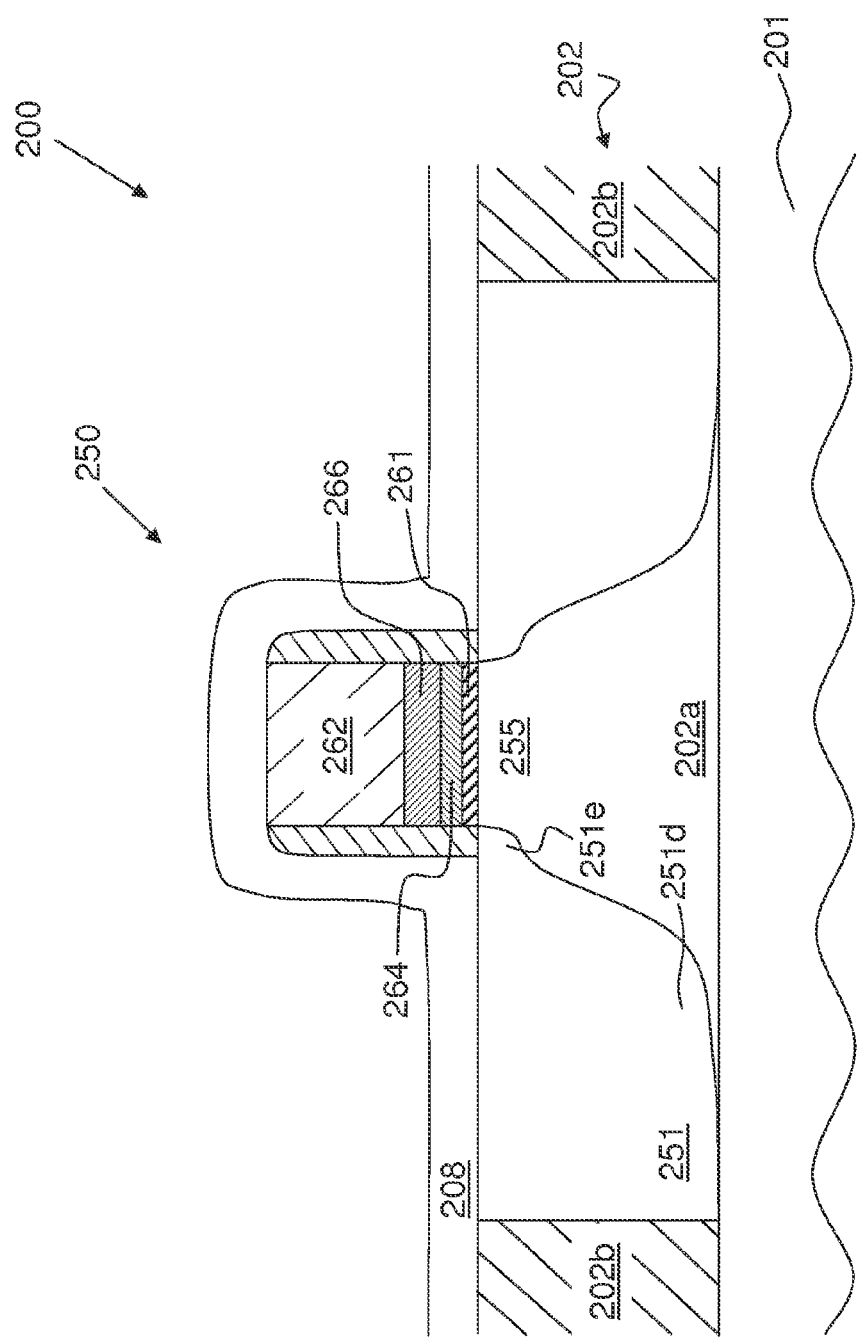

According to the embodiment shown in FIGS. 2c and 2d, a salicidation process is performed after carrying out the activation annealing.

As shown in FIG. 2c, the salicidation starts by depositing a metal layer 208 on the surface of the semiconductor structure 200. The metal layer 208 preferably comprises nickel. Alternatively, the metal layer 208 may comprise titanium or cobalt. It should be noted that, after depositing the metal layer 208, the semiconductor material of the gate material layer 262 is sandwiched between the pure metal layer 266 and the deposited metal layer 208 on top.

After depositing the metal layer 208, a heat treatment is applied to the semiconductor structure 200. The heat treatment may be performed at a temperature in the range of about 300-500° C. for a time period ranging from approximately 10 seconds to a few minutes.

For example, the heat treatment may be a two-step process. A first heat treatment step may be performed in the range of approximately 250-400° C. for a time period of approximately 10-90 seconds. After the first heat treatment step, any non-reacted metal of the layer 208 may be selectively removed by one of a variety of well-known etch/cleaning processes. Finally, a second heat treatment step may be performed in the range of approximately 400-500° C., again for a time period of approximately 10-90 seconds.

FIG. 2d shows the semiconductor structure 200 after the heat treatment included in the salicidation process has been accomplished. The heat treatment initiates a chemical reaction between the metal atoms of the metal layer 208 and the semiconductor atoms included in those surface portions of the semiconductor structure 200 which form an interface with the metal layer 208. This chemical reaction results in formation of metal silicide layer 253 formed partly in and partly on the source/drain regions 251 so as to form an interface therewith. Furthermore, the chemical reaction between the deposited metal layer 208 and the semiconductor material, typically silicon, of the gate material layer 262 results in formation of a metal silicide layer 265 included in the gate structure 260 and having an upper surface exposed to the outside. Metal silicide layers 253 and 265 typically comprise nickel silicide (NiSi).

In contrast to the method and system known from the prior art, the heat treatment included in the salicidation according to the claimed invention further initiates a chemical reaction between the metal atoms in the pure metal layer 266 and the semiconductor material of the gate material layer 262 in contact with the pure metal layer 266. This additional chemical reaction results in formation of a second metal silicide layer 266a lying between the gate metal layer 264 and the first metal silicide layer 265. In some embodiments, the second metal silicide layer 266a comprises at least one of titanium disilicide ($TiSi_2$) or cobalt disilicide ($CoSi_2$).

During the heat treatment, all metal material of the pure metal layer 266 may react with the semiconductor material of the gate metal layer 262. If this is the case, the second metal silicide layer 266a forms an interface with the gate metal layer 264, as shown in FIG. 2d. Alternatively, the thickness of the pure metal layer 266 may be large enough that a residual portion thereof remains on the gate metal layer 264 after completing the heat treatment. In this case, the second metal silicide layer 266a forms an interface with the residual portion of the pure metal layer 266.

According to an advantageous embodiment, the salicidation process is optimized so that all semiconductor material included in the gate material layer 262 reacts during the heating treatment, either with above-lying metal film 208, or with below-lying pure metal layer 266. The parameters of the salicidation process which may be varied in order to optimize the process include type and thickness of the deposited metal layer 208, number of steps of the heat treatment, temperature and duration of the heat treatment, etc.

According to some embodiments, the metal film 208 comprises nickel and has a thickness in the range of about 10-15 nm. Furthermore, the heat treatment is performed in two subsequent stages, as described above. In some embodiments, a first heat treatment is performed at a temperature of approximately 270-330° C. for 10-50 seconds. All unreacted nickel is subsequently stripped. A second heat treatment is performed at a temperature of approximately 400-480° C., again for a time of approximately 10-50 seconds. This second heat treatment transforms the nickel silicide phase into the low-resistivity phase.

If all semiconductor material of the gate material 262 takes part in the reaction during the heat treatment, then first metal silicide layer 265 and the second metal silicide layer 266a are in electrical contact with each other through a shared interface. Thus, the gate structure 250 shown in FIG. 2d is fully silicided, since no semiconductor material is present between the gate metal layer 264 and the exposed metal silicide layer 265.

After the salicidation process, the gate metal layer 264 forms a metal-metal junction either with the second metal silicide layer 266a, or with the residual portion of the pure metal layer 266. Thus, no Schottky barrier is present between the gate metal layer 264 and the layer lying above it. Furthermore, since the second silicide layer 266a forms a metal-metal junction with the first metal silicide layer 265, no Schottky barrier is present between the first metal silicide layer 265 and the second metal silicide layer 266a either.

The semiconductor structure and the method according to the present disclosure provide a significant improvement with respect to the state in the art. By using the claimed manufacturing method, it is possible to implement a gate structure wherein the first metal silicide layer 265 is in electrical contact with the gate metal layer 264 through the second metal silicide layer 266a, without the presence of any metal-semiconductor junctions or Schottky barriers therebetween.

Furthermore, a fully silicided gate can be obtained without having to unduly increase the thickness of the metal silicide 253 contacting the source/drain regions 251 of the transistor. This is achieved due to the presence of an additional pure metal layer 266 between the gate metal layer 264 and the semiconductor gate material 262.

A salicidation process can then be performed wherein the semiconductor gate material 262 reacts with a deposited metal layer 208 lying on top of the gate material and with the metal of the additional metal layer 266 lying under the gate material. If the salicidation is optimized so that all semiconductor material in the gate reacts with the metal on top and under it, then a fully silicided gate is formed.

In contrast to the prior art, in the fully silicided gate hereby proposed, the upper metal silicide layer 265, typically comprising nickel silicide, does not have to extend into the gate structure all the way down to the surface of the gate metal layer 264. Conversely, the thickness of the upper metal silicide layer 265, correlated to the thickness of the gate/source metal silicide layer 253, can be maintained at a relatively low value due to the presence of the additional metal silicide layer 266a sandwiched between the metal silicide layer 265 and the gate metal layer 264. In this respect, the thickness of the pure metal layer 266 can be appropriately chosen so as to have a first metal silicide layer 265 of a given thickness.

FIGS. 2a-2d show an embodiment of the claimed manufacturing flow wherein the first metal silicide layer 265 and the second metal silicide layer 266a are formed in the course of the same silicidation process. However, according to other embodiments not shown in the figures, the second metal silicide layer 266a may be formed before the first metal silicide layer 265.

More specifically, according to a further embodiment, the gate structure is initially formed so as to comprise a gate insulation layer 261, a gate metal layer 264 and a pure metal layer 266 on top of the gate metal layer 264. A first salicidation process is then carried out resulting in a lower metal silicide layer 266a. A gate material layer, typically comprising a semiconductor material such as polysilicon, is then formed on the surface of the lower metal silicide layer 266a. Gate and source regions of the transistor are then formed as described above in relation to the first embodiment. Finally, a second silicidation is performed by depositing a metal-containing layer and performing a heat treatment, as described above with reference to FIGS. 2c and 2d. The second silicidation results in formation of metal silicide layers 253 electrically contacting the source and drain regions of the transistor and of upper metal silicide layer 265 electrically contacting the lower metal silicide layer 266a. After performing the second silicidation process, the system looks again as in FIG. 2d.

Also by means of this second embodiment, a fully silicided gate can be obtained, while maintaining the thicknesses of the metal silicide layers 265 and 253 low. This can again be achieved due to the presence of the lower metal silicide layer 266a.

After the salicidation processes described above, the manufacturing flow continues in a conventional manner.

FIG. 2e shows the semiconductor structure 200 in an advanced manufacturing process stage following that shown in FIG. 2d. As shown in FIG. 2d, after formation of the metal silicide layers 253, 265 and 266a, a stressed material layer 220 is deposited on the surface of the semiconductor structure 200. The stressed material layer 220 may comprise silicon nitride ($Si_3N_4$). Subsequently, a UV curing process is applied at a temperature ranging from 400-500° C.

An interlayer dielectric layer 230 is then deposited on the stressed material layer 220. The interlayer dielectric layer 230 may comprise an oxide, such as, for example, silicon dioxide ($SiO_2$). An etching process is then applied, for example through a patterned mask, in order to form via openings 272 and 274. Openings 272 expose predetermined portions of the metal silicide layer 253 contacting the source and drain regions 251. On the other hand, via openings 274 expose predetermined portions of the first metal silicide layer 265 contacting the gate 260.

Finally, via openings 272 and 274 can be filled with a metal (not shown), for example tungsten or copper, so as to form electrical contacts to the source and drain regions and to the gate electrode of the transistor 250.

The present invention provides a convenient method for forming a fully silicided gate of a transistor, which can, for example, be a FET. The proposed device and method find an advantageous application in semiconductor manufacturing technologies starting from 45 nm and beyond. In particular, the claimed method and device may be applied to the 28 nm technology and beyond. The method and device may be advantageously applied in conjunction with the HKMG technology, particularly within the framework of the gate-first HKMG approach.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, the method comprising:
   forming an active region in a semiconductor layer; and
   forming a gate structure on said active region, wherein forming said gate structure comprises:
      forming an insulating layer on said active region;
      forming a gate metal layer on said insulating layer, wherein said gate metal layer does not comprise silicon-based or metal silicide materials;
      forming a first metal layer on said gate metal layer, wherein said first metal layer does not comprise silicon-based or metal silicide materials;
      forming a gate material layer on said first metal layer; and
      performing a salicidation process to form a first metal silicide layer above said gate metal layer and to form a second metal silicide layer above said first metal silicide layer, said salicidation process comprising:
         depositing a refractory metal layer above said transistor after forming said gate structure; and
         applying a heat treatment to form said second metal silicide layer from at least a portion of said refractory metal layer and at least a portion of said gate material layer.

2. The method of claim 1, wherein said first metal layer comprises at least one of titanium and cobalt.

3. The method of claim 1, wherein forming said gate structure comprises performing a common patterning process on said insulating layer, said gate metal layer, said first metal layer and said gate material layer.

4. The method of claim 1, further comprising forming a source region and a drain region of said transistor in said active region, said source and drain regions being formed after forming said gate structure.

5. The method of claim 1, wherein forming said first metal silicide layer comprises forming a metal silicide material from at least a portion of said gate material layer and at least a portion of said first metal layer.

6. The method of claim 1, wherein said second metal silicide layer comprises nickel silicide.

7. The method of claim 1, wherein said salicidation process is performed in a single step after forming said gate structure.

8. The method of claim 1, wherein performing said salicidation process comprises forming an interface between said first metal silicide layer and said second metal silicide layer.

9. The method of claim 1, wherein performing said salicidation process comprises forming an interface between said first metal silicide layer and said gate metal layer.

10. The method of claim 1, wherein said insulating layer of said gate structure comprises a high-k dielectric material.

11. The method of claim 10, wherein said high-k dielectric material comprises at least one of tantalum oxide ($Ta_2O_5$), strontium titanium oxide ($SrTiO_3$), hafnium oxide ($HfO_2$), hafnium silicon oxide (HfSiO) and zirconium oxide ($ZrO_2$).

12. The method of claim 1, wherein said gate metal layer comprises at least one of tantalum (Ta), tungsten (W), titanium nitride (TiN), and tantalum nitride (TaN).

13. A method, comprising:
   forming a gate structure material stack above an active region formed in a layer of semiconductor material, wherein forming said gate structure material stack comprises:
      forming a gate insulation layer above said active region, said gate insulation layer comprising a high-k dielectric material having a dielectric constant that is greater than approximately 10;
      depositing a metal gate layer above said gate insulation layer, wherein said metal gate layer comprises a work function adjusting metal species but does not comprise silicon-based or metal silicide materials;
      depositing a first metal layer above said metal gate layer, said first metal layer comprising a first refractory metal; and
      forming a silicon-based semiconductor layer on and in contact with an upper surface of said first metal layer;
   performing a common gate patterning process on said gate structure material stack to form a gate structure comprising at least said gate insulation layer, said metal gate layer, said first metal layer and said silicon-based semiconductor layer;
   after forming said gate structure, forming a second metal layer on and in contact with an upper surface of said silicon-based semiconductor layer of said gate structure, said second metal layer comprising a second refractory metal that is different than said first refractory metal; and
   performing at least one heat treatment process to form a first metal silicide material from at least a portion of said first refractory metal of said first metal layer and a lower portion of said silicon-based semiconductor layer and to form a second metal silicide material from at least a portion of said second refractory metal of said second metal layer and an upper portion of said silicon-based semiconductor layer.

14. The method of claim 13, wherein, after performing said at least one heat treatment process, said first metal silicide material forms an interface with said second metal silicide material.

15. The method of claim 13, wherein, after performing said at least one heat treatment process, said first metal silicide material forms an interface with said metal gate layer.

16. The method of claim 13, wherein said first metal silicide material comprises at least one of titanium disilicide ($TiSi_2$) and cobalt disilicide ($CoSi_2$).

17. The method of claim 13, wherein said second metal silicide layer comprises nickel silicide (NiSi).

18. The method of claim 13, wherein said high-k dielectric material comprises at least one of tantalum oxide ($Ta_2O_5$), strontium titanium oxide ($SrTiO_3$), hafnium oxide ($HfO_2$), hafnium silicon oxide (HfSiO) and zirconium oxide ($ZrO_2$).

19. The method of claim 13, wherein said metal gate layer comprises at least one of tantalum (Ta), tungsten (W), titanium nitride (TiN), and tantalum nitride (TaN).

20. A method of forming a transistor, the method comprising:
   forming an active region in a semiconductor layer; and
   forming a gate structure on said active region, wherein forming said gate structure comprises:

forming an insulating layer on said active region;

forming a gate metal layer on said insulating layer, wherein said gate metal layer does not comprise silicon-based or metal silicide materials;

forming a first metal layer on said gate metal layer, wherein said first metal layer does not comprise silicon-based or metal silicide materials;

forming a gate material layer on said first metal layer; and performing a salicidation process to form a first metal silicide layer above said gate metal layer, a second metal silicide layer above said first metal silicide layer, and a third metal silicide layer in said source and drain regions, said salicidation process comprising:

depositing a refractory metal layer above said transistor after forming said gate structure; and applying a heat treatment to form said second metal silicide layer from a first portion of said refractory metal layer and at least a portion of said gate material layer and to form said third metal silicide layer from a second portion of said refractory metal layer and a portion of a semiconductor material comprising said source and drain regions.

21. The method of claim 20, wherein said third metal silicide layer has substantially a same thickness as said second metal silicide layer.

22. The method of claim 20, wherein said first metal layer comprises at least one of titanium (Ti) and cobalt (Co).

23. The method of claim 20, wherein said refractory metal layer comprises nickel.

24. The method of claim 20, wherein performing said salicidation process comprises forming an interface between said first metal silicide layer and said second metal silicide layer.

25. The method of claim 20, wherein performing said salicidation process comprises forming an interface between said first metal silicide layer and said gate metal layer.

26. The method of claim 20, wherein said insulating layer of said gate structure comprises a high-k dielectric material.

27. The method of claim 26, wherein said high-k dielectric material comprises at least one of tantalum oxide ($Ta_2O_5$), strontium titanium oxide ($SrTiO_3$), hafnium oxide ($HfO_2$), hafnium silicon oxide (HfSiO) and zirconium oxide ($ZrO_2$).

28. The method of claim 20, wherein said gate metal layer comprises at least one of tantalum (Ta), tungsten (W), titanium nitride (TiN), and tantalum nitride (TaN).

* * * * *